(12) United States Patent
Ishikawa et al.

(10) Patent No.: US 12,451,385 B2
(45) Date of Patent: Oct. 21, 2025

(54) WAFER PLACEMENT TABLE

(71) Applicant: NGK INSULATORS, LTD., Nagoya (JP)

(72) Inventors: Masaki Ishikawa, Handa (JP); Tatsuya Kuno, Nagoya (JP); Yusuke Ogiso, Nagakute (JP)

(73) Assignee: NGK INSULATORS, LTD., Nagoya (JP)

(\*) Notice: Subject to any disclaimer, the term of this patent is extended or adjusted under 35 U.S.C. 154(b) by 76 days.

(21) Appl. No.: 18/461,611

(22) Filed: Sep. 6, 2023

(65) Prior Publication Data
US 2024/0290646 A1  Aug. 29, 2024

Related U.S. Application Data

(63) Continuation of application No. PCT/JP2023/007066, filed on Feb. 27, 2023.

(51) Int. Cl.
*H01L 21/683* (2006.01)
*H01J 37/32* (2006.01)

(52) U.S. Cl.
CPC .... *H01L 21/6833* (2013.01); *H01J 37/32715* (2013.01); *H01J 2237/2007* (2013.01)

(58) Field of Classification Search
CPC ............ H01L 21/6833; H01J 37/32715; H01J 2237/2007
See application file for complete search history.

(56) References Cited

U.S. PATENT DOCUMENTS

| | | | |
|---|---|---|---|
| 5,539,609 A | * | 7/1996 | Collins ............... H01L 21/6831 361/234 |
| 6,581,275 B2 | | 6/2003 | Narendrnath et al. |
| 12,211,729 B2 | * | 1/2025 | Hirata ............... H01L 21/67103 |
| 2002/0135969 A1 | | 9/2002 | Weldon et al. |
| 2020/0286766 A1 | | 9/2020 | Itoyama et al. |
| 2021/0225619 A1 | | 7/2021 | Suzuki et al. |

(Continued)

FOREIGN PATENT DOCUMENTS

| JP | 2006-344766 A | 12/2006 |
|---|---|---|
| JP | 2010-123712 A | 6/2010 |
| JP | 2020-145280 A | 9/2020 |

(Continued)

OTHER PUBLICATIONS

International Search Report and Written Opinion (Application No. PCT/JP2023/007066) dated May 16, 2023 (8 pages).

(Continued)

*Primary Examiner* — Sean Kayes
*Assistant Examiner* — Samantha L Faubert
(74) *Attorney, Agent, or Firm* — BURR PATENT LAW, PLLC

(57) ABSTRACT

A wafer placement table includes: a ceramic plate having a wafer placement surface on an upper surface and a built-in electrode; a plug placement hole extending through the ceramic plate from a lower surface to the upper surface; a plug placed in the plug placement hole and allowing gas to pass therethrough; and a plug joint joining an outer edge of an upper surface of the plug and an upper opening edge of the plug placement hole and covering the outer edge of the upper surface of the plug from above.

8 Claims, 9 Drawing Sheets

(56) References Cited

U.S. PATENT DOCUMENTS

2022/0026151 A1* 1/2022 Araki .................. F28F 9/0282
2022/0415627 A1 12/2022 Nishi et al.

FOREIGN PATENT DOCUMENTS

| | | |
|---|---|---|
| JP | 6767829 B2 | 10/2020 |
| JP | 2023-003957 A | 1/2023 |
| WO | 2020/004478 A1 | 1/2020 |
| WO | 2020/121898 A1 | 6/2020 |

OTHER PUBLICATIONS

English translation of the International Preliminary Report on Patentability (Chapter I) dated Sep. 11, 2025 (Application No. PCT/JP2023/007066).

\* cited by examiner

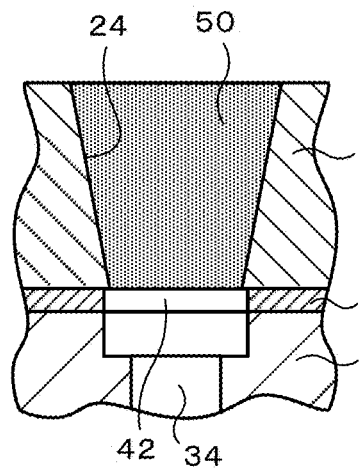
Fig. 7A
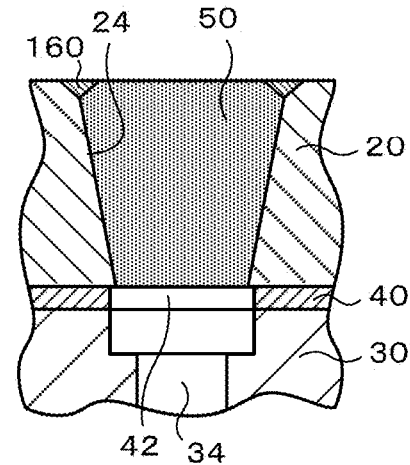
Fig. 7B
Fig. 8
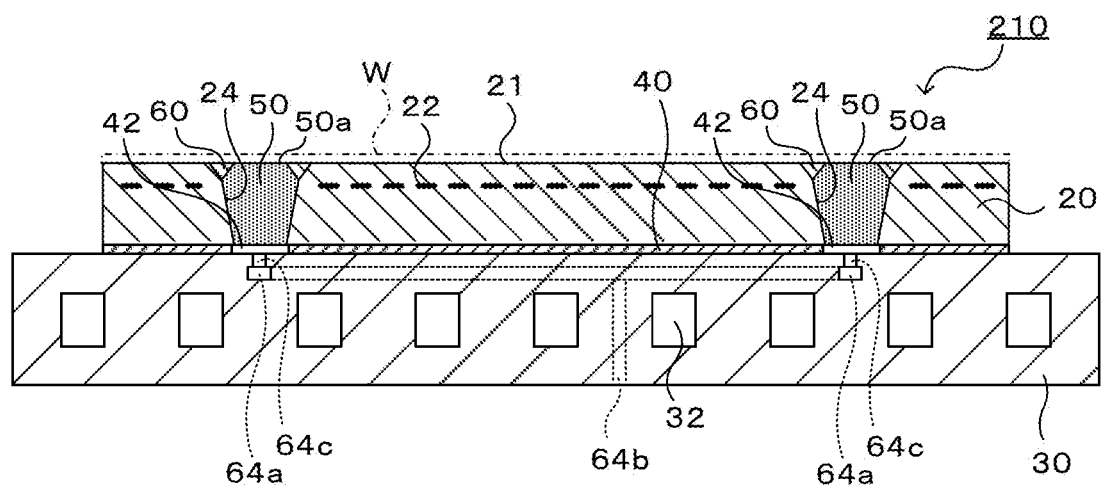

WAFER PLACEMENT TABLE

BACKGROUND OF THE INVENTION

1. Field of the Invention

The present invention relates to a wafer placement table.

2. Description of the Related Art

A wafer placement table has been conventionally used in a semiconductor manufacturing apparatus. For example, the wafer placement table in PTL 1 includes a ceramic plate having a wafer placement surface and a built-in heater, a vent path in the ceramic plate, and a gas-permeable member placed in the vent path. Examples of the gas-permeable member include a member composed of a porous member and a member having one or more through holes. As methods of fixing the gas-permeable member to the vent path, a method including press-fitting the gas-permeable member into the vent path and a method including bonding the permeable member to the vent path with an adhesive are described. Furthermore, it is described that the gas-permeable member is preferably fixed in position by protrusions or the like formed on the inner wall of the vent path so that the gas-permeable member is not moved due to vacuum suction.

CITATION LIST

Patent Literature

PTL 1: Japanese Patent No. 6767829

SUMMARY OF THE INVENTION

However, it was not easy to form protrusions or the like on the inner wall of the vent path to prevent the gas-permeable member from moving.

The present invention was made to solve the above-described problem, and the main object is to provide a simple structure that can prevent a plug from slipping out of a plug placement hole.

[1] A wafer placement table of the present invention includes: a ceramic plate having a wafer placement surface on an upper surface and a built-in electrode; a plug placement hole extending through the ceramic plate from a lower surface to the upper surface; a plug placed in the plug placement hole and allowing gas to pass therethrough; and a plug joint joining an outer edge of an upper surface of the plug and an upper opening edge of the plug placement hole and covering the outer edge of the upper surface of the plug from above.

In this wafer placement table, a plug that allows gas to pass therethrough is placed in the plug placement hole. The outer edge of the upper surface of the plug and the upper opening edge of the plug placement hole are joined together by a plug joint. The plug joint covers the outer edge of the upper surface of the plug from above. The plug joint is caught on the upper outer edge of the plug, preventing the plug from slipping upward out of the plug placement hole. This simple structure in which the plug joint covers the outer edge of the upper surface of the plug from above can prevent the plug from slipping upward out of the plug placement hole.

In this specification, up and down, left and right, and front and back, for example, are used to describe the present invention, but up and down, left and right, and front and back represent only a relative positional relationship. Thus, when the orientation of the wafer placement table is changed, up and down may become left and right, or left and right may become up and down. Such cases are also included in the technical scope of the present invention.

[2] In the wafer placement table of the present invention (wafer placement table described in [1] above), the plug joint may be disposed over an entire circumference of the plug along the outer edge of the upper surface. This increases joint strength of the plug joint because the plug joint is disposed over the entire circumference of the plug.

[3] In the wafer placement table of the present invention (wafer placement table described in [1] above), the plug joint may be disposed at least two respective positions arranged in a circumferential direction along the outer edge of the upper surface of the plug. This configuration, which has the plug joint not disposed over the entire circumference but disposed at least two respective positions arranged in the circumferential direction along the outer edge of the upper surface of the plug, enables the plug joint to be readily removed later. For example, when the plug needs to be replaced, the plug can be readily replaced.

[4] In the wafer placement table of the present invention (wafer placement table described in any one of [1] to [3] above), the plug may have a plug sloping surface at the outer edge of the upper surface, the plug placement hole may have a placement hole sloping surface at the upper opening edge, and the plug joint may be a thermal-sprayed portion filling a groove defined by the plug sloping surface and the placement hole sloping surface. This configuration enables the plug joint to be relatively readily formed by thermal spraying. The sloping surfaces may be flat or curved (concave or convex).

[5] In the wafer placement table of the present invention (wafer placement table described in any one of [1] to [3] above), the plug joint may be a laser weld where the outer edge of the upper surface of the plug and the upper opening edge of the plug placement hole have been laser welded. This configuration enables the plug joint to be relatively readily formed by laser welding. Here, the plug joint, which is a laser weld, may be disposed at least two respective positions in the circumferential direction. In such a case, the risk of cracking caused by laser welding can be reduced because a smaller area is subjected to welding. Furthermore, when the plug needs to be replaced, it is easier to remove the old plug because fewer laser welds need to be removed. After the old plug is removed, if a new plug is required to be placed in the plug placement hole and laser welded, laser welding should be performed on portions that have not been laser welded.

[6] In the wafer placement table of the present invention (wafer placement table described in [5] above), the laser weld may have an inverted triangle shape when viewed in a vertical cross-section, and a lowest portion of the laser weld may be located in the plug. In this configuration, a portion to be laser-irradiated in the process of forming the laser weld is in the plug. Thus, laser irradiation is unlikely to cause cracks in the ceramic plate. If a crack occurs in the ceramic plate, the plug placement hole and the electrode may be connected by the crack, but such a situation can be prevented.

[7] The wafer placement table of the present invention (wafer placement table described in any one of [1] to [6] above) may further include a conductive plate bonded to a lower surface of the ceramic plate and having a gas supply channel in communication with the plug placement hole. The conductive plate may be used as a cooling plate that cools the ceramic plate or as a high frequency electrode that generates plasma above the wafer placement surface.

BRIEF DESCRIPTION OF THE DRAWINGS

FIGS. 7A and 7B illustrate a process of producing the wafer placement table 110.
FIG. 8 is a vertical cross-sectional view of a wafer placement table 210.

DETAILED DESCRIPTION OF THE INVENTION

First Embodiment

Figure 1:
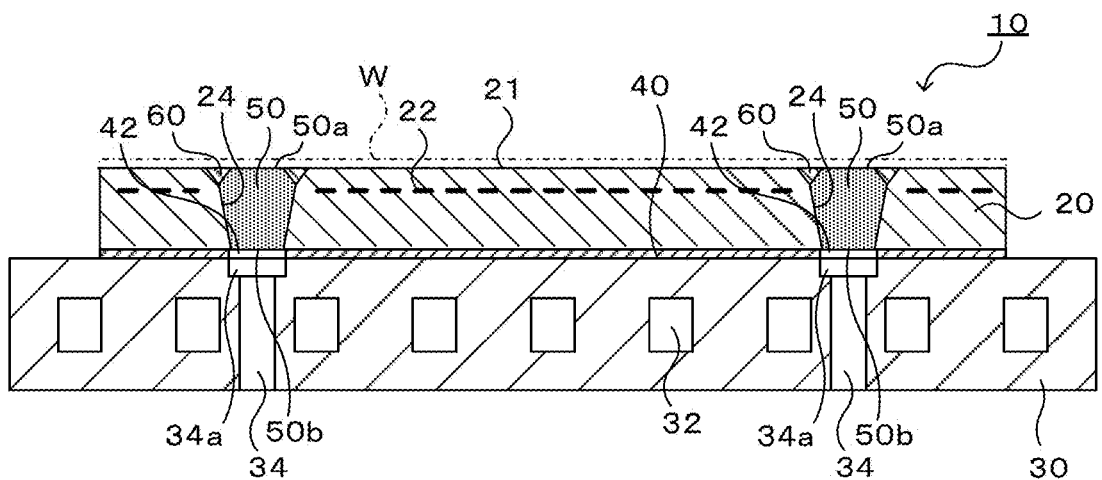
FIG. 1 is a vertical cross-sectional view of a wafer placement table 10.
Figure 2:
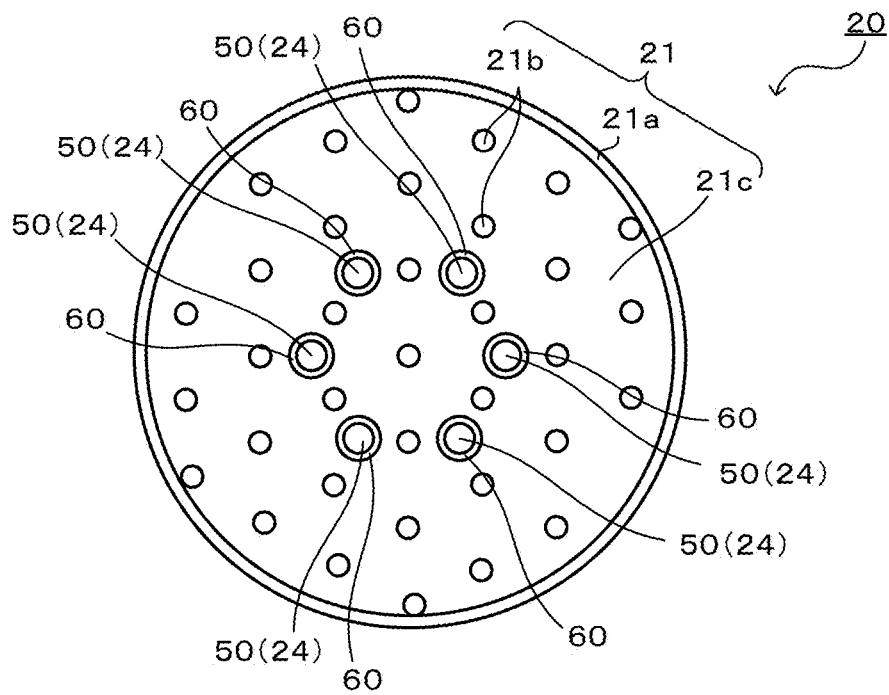
FIG. 2 is a plan view of a ceramic plate 20.
Figure 3:
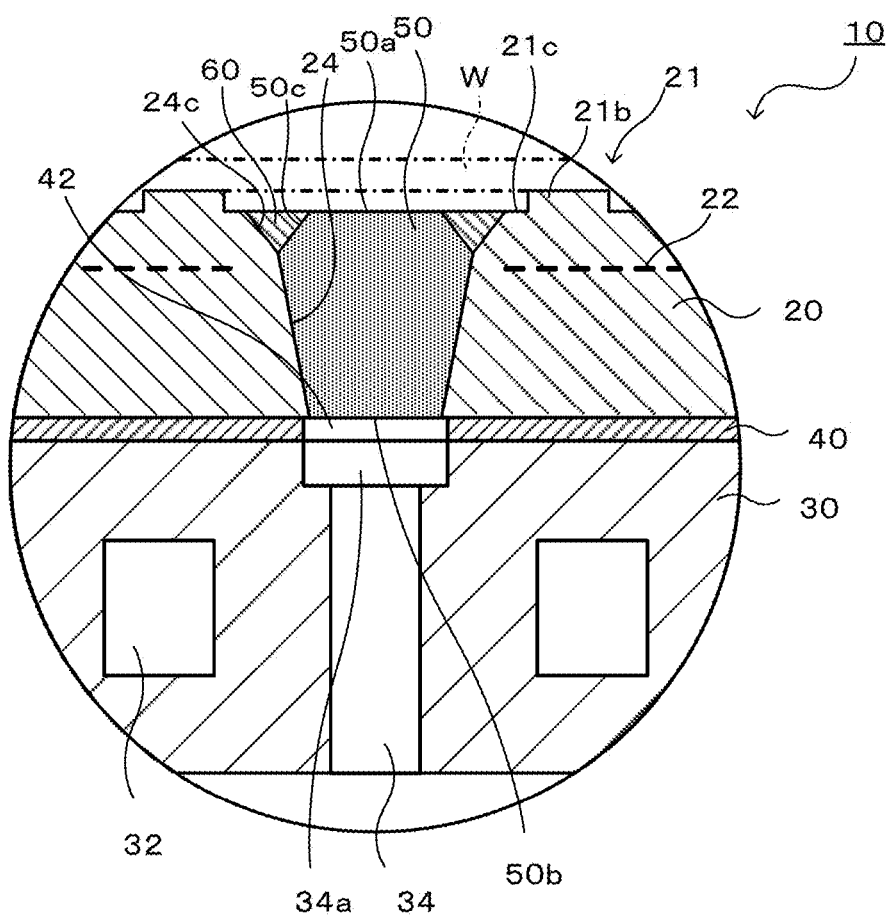
FIG. 3 is a partial magnified view of FIG. 1.

A first embodiment will be described with reference to the drawings. FIG. 1 is a vertical cross-sectional view of a wafer placement table 10, FIG. 2 is a plan view of a ceramic plate 20, and FIG. 3 is a partial magnified view of FIG. 1.

The wafer placement table 10 includes a ceramic plate 20, a plug placement hole 24, a base plate (conductive plate) 30, a metal bonding layer 40, a plug 50, and a plug joint 60.

The ceramic plate 20 is a disc (for example, having a diameter of 300 mm and a thickness of 5 mm) formed of ceramic, such as an alumina sintered body and an aluminum nitride sintered body. The upper surface of the ceramic plate 20 is a wafer placement surface 21. The ceramic plate 20 has a built-in electrode 22. As illustrated in FIG. 2, the wafer placement surface 21 of the ceramic plate 20 has a seal band 21a along the outer edge and multiple small circular projections 21b over the entire area. The seal band 21a and the small circular projections 21b have the same height, and the height is, for example, several to tens of micrometers. The electrode 22 is a flat mesh electrode used as an electrostatic electrode, and a DC voltage can be applied across the electrode 22. When a DC voltage is applied across the electrode 22, the wafer W is attracted and fixed to the wafer placement surface 21 (specifically, the upper surface of the seal band 21a and the upper surfaces of the small circular projections 21b) by the electrostatic attraction. When the application of a DC voltage is stopped, the wafer W is not attracted and fixed to the wafer placement surface 21. An area of the wafer placement surface 21 not having the seal band 21a and the small circular projections 21b is referred to as a reference surface 21c.

The plug placement hole 24 is a hole extending through the ceramic plate 20 from the lower surface to the upper surface, here a through hole extending in an up-down direction through the ceramic plate 20. The plug placement hole 24 is opposed to a gas hole 34 in the base plate 30. The plug placement hole 24 extends in the up-down direction through the electrode 22, but the electrode 22 is not exposed on the inner circumferential surface of the plug placement hole 24. The plug placement hole 24 is a tapered hole having a truncated conical space in which the upper opening area is larger than the lower opening area. As illustrated in FIG. 3, the plug placement hole 24 has a placement hole sloping surface 24c formed by C-chamfering at the upper opening edge over the entire circumference. The placement hole sloping surface 24c is flat, not curved. As illustrated in FIG. 2, the ceramic plate 20 has the plug placement holes 24 at multiple locations (e.g., at multiple locations equally spaced in the circumferential direction).

The base plate 30 is a conductive disc having high thermal conductivity (a disc having a diameter equal to or larger than that of the ceramic plate 20). The base plate 30 internally includes a refrigerant flow path 32 through which a refrigerant (e.g., an electrically insulating liquid such as a fluorine-based inert liquid) circulates and a gas hole 34 through which gas is supplied to the plug 50. The gas hole 34 extends in the up-down direction through the base plate 30 and has a large-diameter portion 34a at an upper portion. The large-diameter portion 34a encircles the lower opening of the plug placement hole 24 in plan view. The refrigerant flow path 32 extends in a one-stroke pattern over the entire area of the base plate 30 from the inlet to the outlet in plan view. Examples of the material of the base plate 30 include metals and composite materials. Examples of the metals include Mo. Examples of the composite materials include a metal-ceramic composite material. Examples of the metal-ceramic composite material include metal matrix composite materials (MMCs) and ceramic matrix composite materials (CMCs). Specific examples of these composite materials include materials containing Si, SiC, and Ti, and materials prepared by impregnating SiC porous bodies with Al and/or Si. The material containing Si, SiC, and Ti is referred to as SiSiCTi. The material prepared by impregnating a SiC porous body with Al is referred to as AlSiC, and the material prepared by impregnating a SiC porous body with Si is referred to as SiSiC. The material of the base plate 30 is preferably a material having a coefficient of thermal expansion close to that of the material of the ceramic plate 20. The base plate 30 may also be used as an RF electrode. Specifically, an upper electrode (not illustrated) is disposed above the wafer placement surface 21, and then high-frequency power is applied between parallel plate electrodes consisting of the upper electrode and the base plate 30 to generate plasma.

The metal bonding layer 40 bonds the lower surface of the ceramic plate 20 and the upper surface of the base plate 30 to each other. The metal joint layer 40 is formed, for example, by TCB (thermal compression bonding). The TCB is a well-known method in which a metallic joint member is held between two members to be joined together and the two members are heated to a temperature equal to or lower than the solidus temperature of the metallic joint member to pressure-bond the two members together. The metal bonding layer 40 may be a layer formed of solder or a metal brazing material. The metal bonding layer 40 has a through hole 42. The through hole 42 is located at a position opposed to the large-diameter portion 34a of the gas hole 34. The through hole 42 is coaxial with the large-diameter portion 34a, and the through hole 42 and the large-diameter portion 34a have the same diameter. In this specification, the word "same" includes not only a case of being completely the same but also a case of being substantially the same (for example, a case of being within tolerance) (the same applies hereinafter).

The plug 50 is placed in the plug placement hole 24. The plug 50 is an electrically insulating member that allows gas to flow therethrough in the vertical direction. Here, the plug 50 is a porous ceramic member and may be a porous member formed of the same material as the ceramic plate 20. The plug 50 has a porosity of, preferably, greater than or equal to 30%, and an average pore diameter of, preferably, greater than or equal to 20μ m. As illustrated in FIG. 3, the plug 50 has a plug sloping surface 50c formed by C-chamfering at the outer edge of the upper surface over the entire circumference. The plug sloping surface 50c is flat, not curved. The plug 50 is a truncated conical member in which the upper surface area is larger than the lower surface area. This prevents the plug 50 from slipping downward out of the plug placement hole 24. The upper surface 50a of the plug 50 is exposed in the upper opening of the plug placement hole 24 and is flush with the reference plane 21c. The term "flush with" herein includes not only a case of being complete flush with but also include a case of being substantially flush with (for example, a case of being within tolerances) (the same applies hereinafter). The plug 50 and the plug placement hole 24 are designed in advance so that the upper surface 50a of the plug 50 and the reference surface 21c of the ceramic plate 20 are located at the same height when the plug 50 is inserted into the plug placement hole 24 to fit the outer circumferential surface of the plug 50 and the inner circumferential surface of the plug placement hole 24 together. The upper surface 50a of the plug 50 and the reference surface 21c of the ceramic plate 20 can be readily made flush with each other. The lower surface 50b of the plug 50 may be flush with or located at a higher or lower level than the lower surface of the ceramic plate 20.

A plug joint 60 joins the outer edge of the upper surface of the plug 50 and the upper opening edge of the plug placement hole 24 and covers the outer edge of the upper surface of the plug 50 and the upper opening edge of the plug placement hole 24 from above. Here, the plug joint 60 is formed of a ceramic material filling a groove defined by the plug sloping surface 50c, which is provided at the outer edge of the upper surface of the plug 50 over the entire circumference, and the placement hole sloping surface 24c, which is provided at the upper opening edge of the plug placement hole 24 over the entire circumference, by thermal spraying. The sloping surfaces 24c and 50c are flat, not curved. This groove has a ring-shape in plan view and a V-shape in cross section. Both the plug sloping surface 50c and the placement hole sloping surface 24c are covered by the plug joint 60 from above. The upper surface of the plug joint 60 is flush with the upper surface 50a of the plug 50 and the reference surface 21c of the wafer placement surface 21. However, the upper surface of the plug joint 60 may be located above the reference surface 21c without being located above the upper surfaces of the small circular projections 21b or may be located slightly below the reference surface 21c.

Next, a usage example of the wafer placement table 10 having the above-described configuration will be described. First, a wafer W is placed on the wafer placement surface 21 of the wafer placement table 10 mounted in a chamber (not illustrated). Then, the chamber is depressurized by a vacuum pump to a predetermined vacuum degree, and a DC voltage is applied across the electrode 22 of the ceramic plate 20 to generate an electrostatic attraction force. This allows the wafer W to be attracted and fixed to the wafer placement surface 21 (specifically, the upper surface of the seal band 21a and the upper surfaces of the small circular projections 21b). Next, a reaction gas atmosphere having a predetermined pressure (e.g., tens to hundreds of Pa) is created in the chamber. In this state, a high-frequency voltage is applied between an upper electrode (not illustrated) on the ceiling of the chamber and the base plate 30 of the wafer placement table 10 to generate plasma. The surface of the wafer W is treated by the generated plasma. A refrigerant is circulated in the refrigerant flow path 32 of the base plate 30. Backside gas is introduced from a gas cylinder (not illustrated) to the gas hole 34. The backside gas may be a heat transfer gas (e.g., helium gas). The backside gas flows through the gas hole 34, the through hole 42, and the plug 50 to a space between the backside of the wafer W and the reference surface 21c of the wafer placement surface 21 and is sealed in the space. The presence of the backside gas increases efficiency of heat conduction between the wafer W and the ceramic plate 20.

Figure 4A:
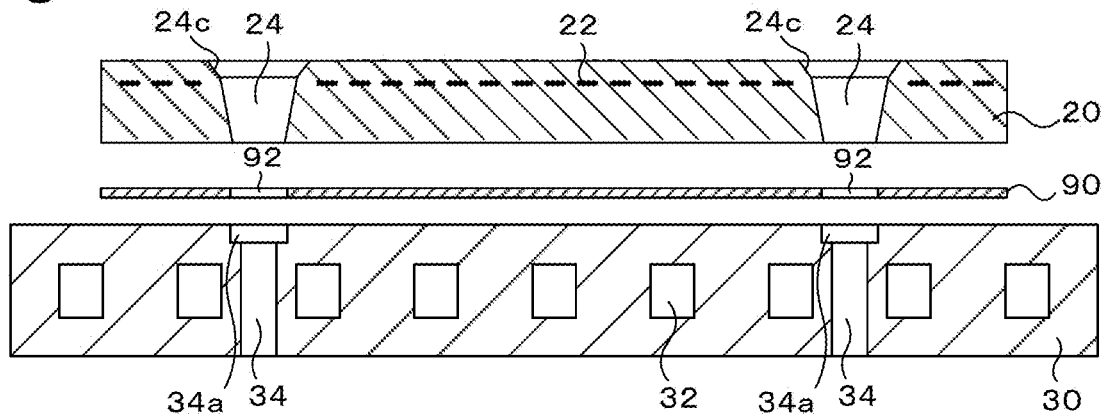
FIGS. 4A to 4D illustrate a process of producing the wafer placement table 10.

Next, an example of a process of producing the wafer placement table 10 will be described with reference to FIGS. 4A to 4D. FIGS. 4A to 4D illustrate a process of producing the wafer placement table 10. First, the ceramic plate 20, the base plate 30, and a metal bonding material 90 are provided (FIG. 4A). The ceramic plate 20 includes the built-in electrode 22 and the plug placement holes 24. The plug placement hole 24 has the placement hole sloping surface 24c formed by C-chamfering at the upper opening edge. The base plate 30 has the refrigerant flow paths 32 and the gas holes 34. The gas hole 34 has the large-diameter portion 34a at an upper portion. The metal bonding material 90 has through holes 92 at positions opposed to the large-diameter portions 34a of the gas holes 34.

Figure 4B:
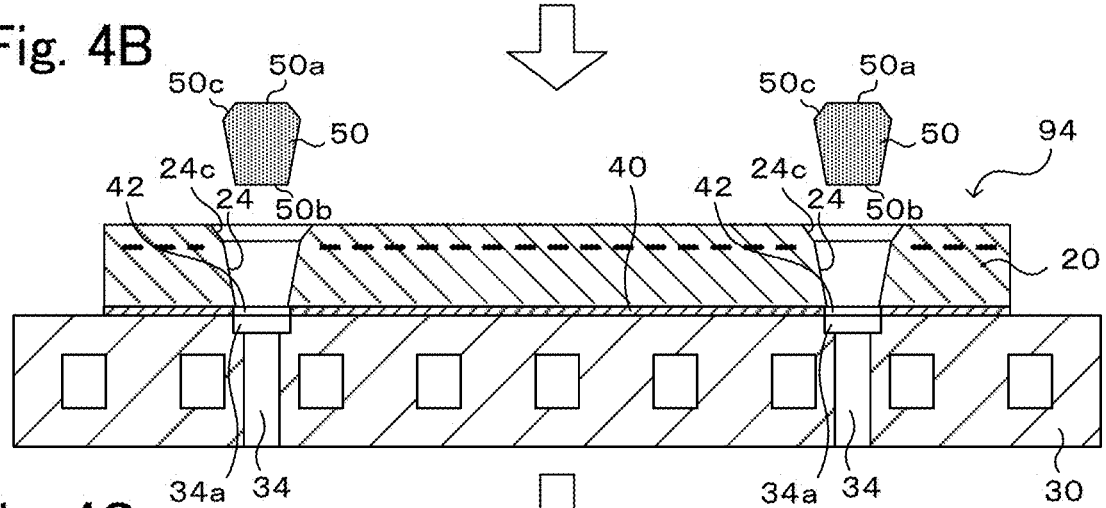

Then, the metal bonding material 90 is sandwiched between the lower surface of the ceramic plate 20 and the upper surface of the base plate 30 to form a layered body. At this time, the stacking is performed so that the plug placement holes 24 in the ceramic plate 20, the through holes 92 in the metal bonding material 90, and the gas holes 34 in the base plate 30 become coaxial. The layered body is then pressurized in such a manner that the layers are joined at a temperature not higher than the solidus temperature of the metal bonding material 90 (e.g., not lower than the solidus temperature minus 20° C. and not higher than the solidus temperature), and then the temperature is returned to a room temperature (TCB). This changes the metal bonding material 90 and the through holes 92 into a metal bonding layer 40 and the through holes 42, respectively, and forms a joined body 94 in which the ceramic plate 20 and the base plate 30 are joined by the metal bonding layer 40 (FIG. 4B). The metal bonding material 90 may be an Al—Mg or Al—Si—Mg bonding material. The metal bonding material 90 having a thickness of about 100μ m is preferably used.

Figure 4C:
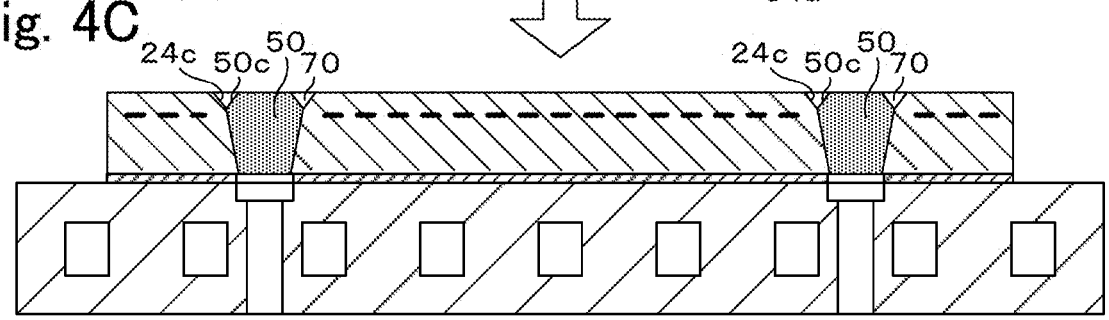

Then, the truncated conical plug 50 is provided (FIG. 4B). The plug 50 has the plug sloping surface 50c formed by C-chamfering at the outer edge of the upper surface. Then, the plug 50 is inserted into the plug placement hole 24 (FIG. 4C). This allows the plug sloping surface 50c of the plug 50 and the placement hole sloping surface 24c of the plug placement hole 24 to define a groove 70 that is ring-shaped in plan view and V-shaped in cross section.

Figure 4D:
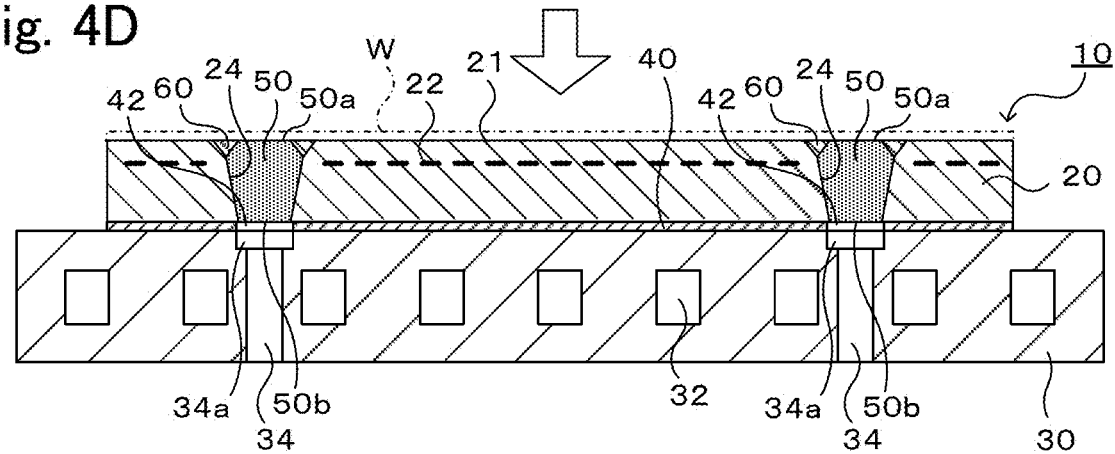

Then, thermal spraying is performed to fill the groove 70 with a ceramic material. The plug joint 60 fills the groove 70. The plug joint 60 covers the plug sloping surface 50c and the placement hole sloping surface 24c from above. A raised portion of the plug joint 60 is flattened by grinding. Finally, the seal band 21a and the small circular projections 21b are provided on the upper surface of the ceramic plate 20 to produce the wafer placement table 10 (FIG. 4D). The plug joint 60 may be formed by thermal spraying after the seal band 21a and the small circular projections 21b are provided on the upper surface of the ceramic plate 20.

In the above-described wafer placement table 10, the plug 50 that allows gas to pass therethrough is placed in the plug placement hole 24. The outer edge of the upper surface of the plug 50 and the upper opening edge of the plug placement hole 24 are joined by the plug joint 60. The plug joint 60, which covers the outer edge of the upper surface of the plug 50 from above, prevents the plug 50 from slipping upward out of the plug placement hole 24. As above, the simple structure in which the plug joint 60 covers the outer edge of the upper surface the plug 50 from above can prevent the plug 50 from slipping upward out of the plug placement hole 24.

Furthermore, the plug joint 60 is disposed over the entire circumference of the plug 50, increasing the joint strength of the plug joint 60.

Furthermore, the plug joint 60 is a thermal-sprayed portion that fills the groove 70 defined by the plug sloping surface 50c and the placement hole sloping surface 24c. The plug joint 60 can be relatively readily formed by thermal spraying.

Second Embodiment

Figure 5:
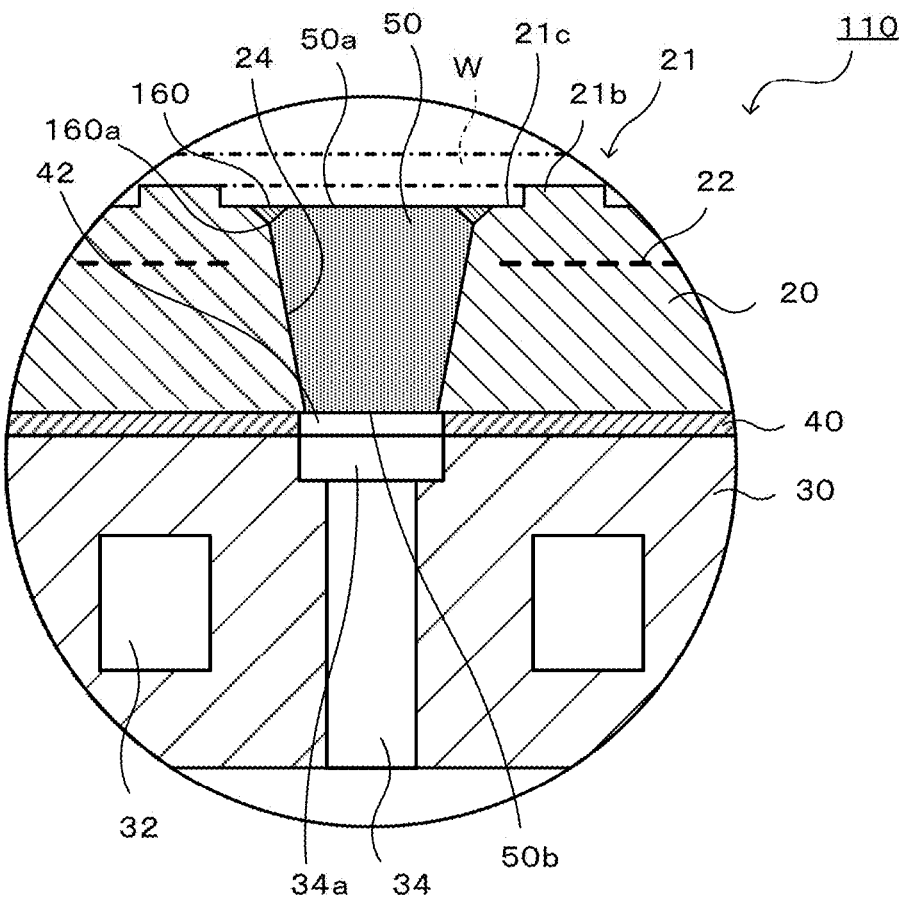
FIG. 5 is a vertical magnified cross-sectional view of a wafer placement table 110 having a plug joint 160.
Figure 6:
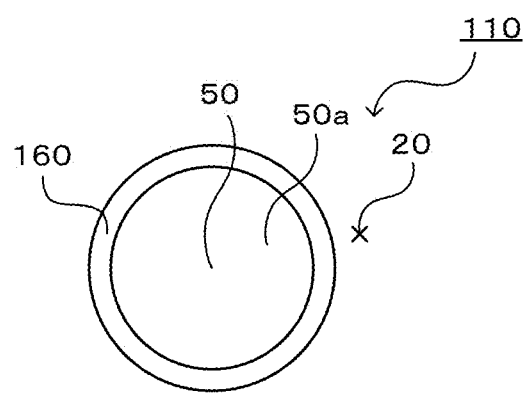
FIG. 6 is a plan view of the plug joint 160 and its surroundings.

A wafer placement table 110 according to a second embodiment will be described with reference to the drawings. FIG. 5 is a vertical magnified cross-sectional view of the wafer placement table 110 having a plug joint 160, FIG. 6 is a plan view of the plug joint 160 and its surroundings, and FIGS. 7A and 7B illustrate (a part of) a process of producing the wafer placement table 110. In FIGS. 5 to 7A and 7B, the same symbols are assigned to the components of the wafer placement table 110 that are the same as those of the wafer placement table 10, and explanations of the components are omitted.

The wafer placement table 110 includes the ceramic plate 20, the plug placement holes 24, the base plate (conductive plate) 30, the metal bonding layer 40, the plugs 50, and the plug joints 160.

The plug joint 160 is a laser weld where the outer edge of the upper surface of the plug 50 and the upper opening edge of the plug placement hole 24 have been laser welded. The plug joint 160 has an inverted triangular cross-sectional shape, and the lowest portion of the plug joint 160 is located at the boundary between the plug 50 and the plug placement hole 24. The plug joint 160 joins the outer edge of the upper surface of the plug 50 and the upper opening edge of the plug placement hole 24 and covers the outer edge of the upper surface of the plug 50 and the upper opening edge of the plug placement hole 24 from above. The plug joint 160 is disposed over the entire circumference of the plug 50 along the outer edge of the upper surface.

The usage example of the wafer placement table 110 is the same as that of the wafer placement table 10 and thus is not explained.

The following is an explanation of the differences between the production example of the wafer placement table 110 and the production example of the wafer placement table 10. In production of the wafer placement table 10, the upper opening edge of the plug placement hole 24 was C-chamfered to form the placement hole sloping surface 24c, and the outer edge of the upper surface of the plug 50 was C-chamfered to form the plug sloping surface 50c. However, the production of the wafer placement table 110 does not involve such chamfering. Thus, when the plug 50 is inserted into the plug placement hole 24, the upper opening edge of the plug placement hole 24 is in contact with the outer edge of the upper surface of the plug 50 (FIG. 7A). In this state, the boundary between the upper opening edge of the plug placement hole 24 and the outer edge of the upper surface of the plug 50 is irradiated with a laser (e.g., a nanosecond laser, a picosecond laser, a femtosecond laser) to be locally heated to a high temperature. This welds the upper opening edge of the plug placement hole 24 and the outer edge of the upper surface of the plug 50 together, forming a laser weld. Due to the characteristics of laser welding, the cross section of the laser weld decreases in width (diameter) from top to bottom. A portion of the laser weld that is raised from the surface is flattened by grinding. The plug joint 160 is formed in this way (FIG. 7B).

In the above-described wafer placement table 110, the plug joint 160 covers the outer edge of the upper surface of the plug 50 from above. The plug joint 160 is caught on the upper outer edge of the plug 50, preventing the plug 50 from slipping upward out of the plug placement hole 24. In this way, this simple structure in which the plug joint 160 covers the outer edge of the upper surface of the plug 50 from above can prevent the plug 50 from slipping upward out of the plug placement hole 24.

Furthermore, the plug joint 160 is disposed over the entire circumference along the outer edge of the upper surface of the plug 50, increasing the joint strength of the plug joint 160.

Furthermore, the plug joint 160 is a laser weld formed at a boundary between the outer edge of the upper surface of the plug 50 and the upper opening edge of the plug placement hole 24 by laser welding. Thus, the plug joint 160 can be formed relatively readily by laser welding. When the plug joint 160 is formed by laser welding, the chamfering of the outer edge of the upper surface of the plug 50 and the upper opening edge of the plug placement hole 24, which is required in the first embodiment, is unnecessary.

The present invention is not limited to the above-described embodiment, and can be carried out by various modes as long as they belong to the technical scope of the invention.

In the above-described first and second embodiments, the plug 50 composed of a porous member was described as an example of a plug that allows gas to flow therethrough in the vertical direction, but the plug should not be limited to this. For example, the plug may be a dense plug that has an internal flow path through which gas can flow in the vertical direction (e.g., straight or spiral flow path).

In the above-described first and second embodiments, the plug 50 having a truncated conical shape was described as an example, but the shape of the plug should not be limited to this. For example, the plug may have a cylindrical shape.

In the above-described first and second embodiments, the gas hole 34 was the stepped hole having the large-diameter portion 34a at its upper portion, but the gas hole should not be limited to this. For example, the gas hole 34 may be a straight hole.

In the above-described first and second embodiments, an electrostatic electrode is described as an example of the electrode 22 built in the ceramic plate 20, but the electrode should not be limited to this. For example, the ceramic plate 20 may include a built-in heater electrode (a resistance heating element) or an RF electrode instead of or in addition to the electrode 22.

In the above-described first and second embodiments, the ceramic plate 20 and the base plate 30 were joined with the metal bonding layer 40, but a resin adhesive layer may be used instead of the metal bonding layer 40.

In the above-described first embodiment, the base plate 30 has the gas holes 34 that constitute gas supply channel, but the gas supply path should not be limited to this. For example, as illustrated in FIG. 8, the base plate 30 may have a ring section 64a concentric to the base plate 30 in plan view, an introduction section 64b that introduces gas from the back of the base plate 30 to the ring section 64a, and a distribution section 64c that distributes gas from the ring section 64a to each plug 50. In FIG. 8, the same symbols are assigned to the same components as those in the above-described first embodiment. The number of introduction sections 64b may be smaller than the number of distribution sections 64c, e.g., one. In this way, the number of external gas lines connected to the lower surface of the base plate 30 is made smaller than the number of plugs 50. The second embodiment may employ such a configuration.

In the above-described first embodiment, the outer edge of the upper surface of the plug 50 and the upper opening edge of the plug placement hole 24 are C-chamfered, but the type of chamfering is not limited to the C-chamfering. For example, R-chamfering, i.e., rounding may be employed. In this case, the sloping surfaces 24c and 50c are curved (convex). Furthermore, before the formation of the plug joint 60 (FIG. 4C), the groove 70 having a V-shape in cross section was defined by the outer edge of the upper surface of the plug 50 and the upper opening edge of the plug placement hole 24, but the shape of the groove should not be limited to this. For example, the outer edge of the upper surface of the plug 50 and the upper opening edge of the plug placement hole 24 may be processed such that a groove having a U-shape in cross section is defined by the outer edge of the upper surface of the plug 50 and the upper opening edge of the plug placement hole 24. In this case, the plug joint 60 has a substantially rectangular shape in cross section.

Figure 9:
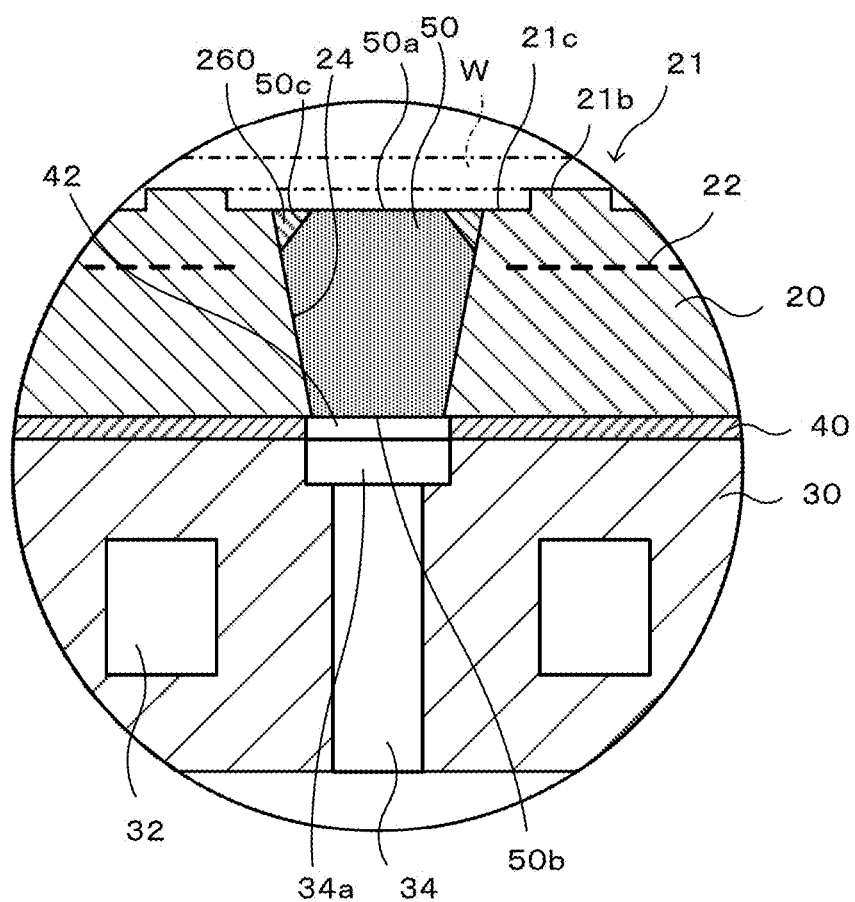
FIG. 9 is a vertical magnified cross-sectional view of a wafer placement table having a plug joint 260.

In the above-described first embodiment, the upper opening edge of the plug placement hole 24 is chamfered over the entire circumference to form the placement hole sloping surface 24c, but the placement hole sloping surface 24c may be eliminated. An example of such a case is illustrated in FIG. 9. In FIG. 9, the same symbols are assigned to the same components as those in the first embodiment. A plug joint 260 in FIG. 9 is a thermal-sprayed portion that joins the plug sloping surface 50c provided at the outer edge of the upper surface of the plug 50 and the upper opening edge of the plug placement hole 24 not having the placement hole sloping surface 24c. The plug joint 260 is formed by thermal spraying to cover the outer edge of the upper surface of the plug sloping surface 50c from above. This simple structure can also prevent the plug 50 from slipping upward out of the plug placement hole 24.

Figure 10:
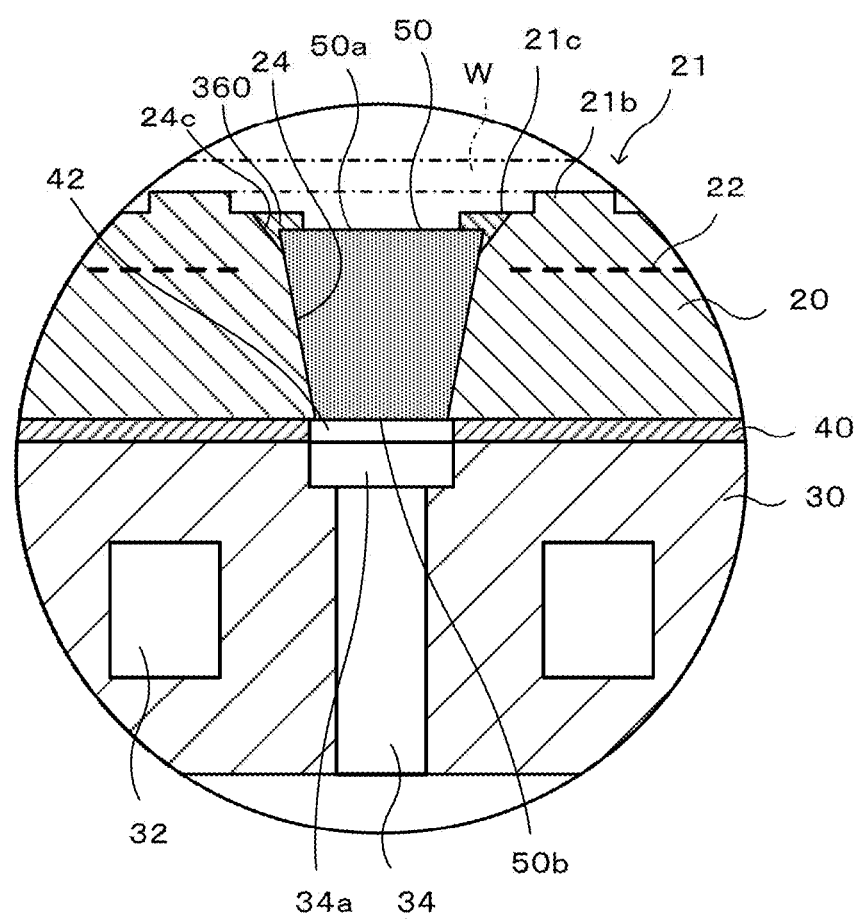
FIG. 10 is a vertical magnified cross-sectional view of a wafer placement table having a plug joint 360.

In the above-described first embodiment, the outer edge of the upper surface of the plug 50 was chamfered over the entire circumference to form the plug sloping surface 50c, but the plug sloping surface 50c may be eliminated. An example of such a case is illustrated in FIG. 10. In FIG. 10, the same symbols are assigned to the same components as those in the first embodiment. A plug joint 360 in FIG. 10 is a thermal-sprayed portion that joins the outer edge of the upper surface of the plug 50 not having the plug sloping surface 50c and the placement hole sloping surface 24c provided at the upper opening edge of the plug placement hole 24. Furthermore, the plug joint 360 is formed by thermal spraying to cover the outer edge of the upper surface of the plug 50 and the placement hole sloping surface 24c of the plug placement hole 24 from above. This simple structure can also prevent the plug 50 from slipping upward out of the plug placement hole 24.

In the above-described first embodiment, the plug joint 60 was formed by thermal spraying, but the method of forming the plug joint should not be limited to the thermal spraying. For example, the plug joint 60 may be formed by aerosol deposition. Alternatively, the plug joint 60 may be formed by a process including filling the V-shaped groove 70 in FIG. 4C with ceramic powder and locally heating the ceramic powder with a laser to sinter the ceramic powder.

Figure 11:
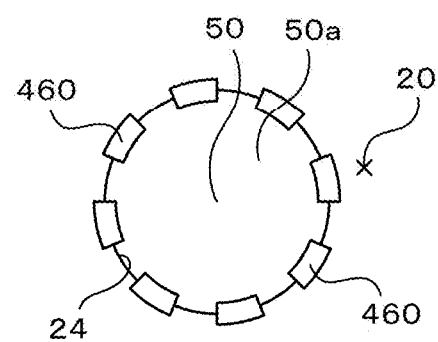
FIG. 11 is a plan view of a plug joint 460 and its surroundings.
Figure 12:
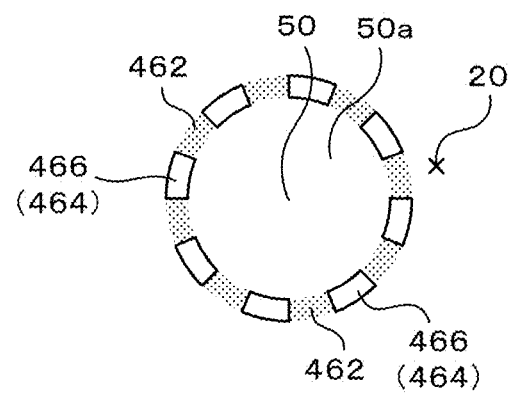
FIG. 12 is a plan view of a plug joint 466 and its surroundings.

In the above-described second embodiment, the plug joint 160 is disposed over the entire circumference of the plug 50 along the outer edge of the upper surface, but the plug joint should not be limited to this. For example, as illustrated in FIG. 11, the plug joint 460 may be disposed at least two (here, eight) respective positions in the circumferential direction along the outer edge of the upper surface of the plug 50. In FIG. 11, the same symbols are assigned to the same components as those in the second embodiment. This configuration has a lower joint strength than the configuration in the second embodiment, but the strength is high enough for practical use. Furthermore, since a smaller area is irradiated with a laser than in the second embodiment, the plug 50 and the ceramic plate 20 are less likely to have cracks. Furthermore, if the plug 50 needs to be replaced, the plug joint 460 can be readily removed because the plug joint 460 is shorter than that in the second embodiment. When a different plug 50 is newly placed in the plug placement hole 24 and laser welded after removal of the old plug 50, as illustrated in FIG. 12, different portions 464 than the previously laser welded portions 462 (shaded) are laser welded to form new plug joints 466. The previously laser welded portions 462 cannot be laser welded again. If the plug needs to be replaced two times or more, portions as many as the number of times the plug will be replaced should be left for laser welding.

The plug joint 60 of the above-described first embodiment may be also disposed at least two respective positions like the plug joint 460 in FIG. 11. This configuration has a lower joint strength than the configuration in the first embodiment, but the strength is high enough for practical use. Furthermore, since a smaller area is subjected to thermal spraying than that in the first embodiment, the plug 50 and the ceramic plate 20 are less likely to have cracks, and if the plug 50 needs to be replaced, the thermal-sprayed portion can be readily removed because the length of the thermal-sprayed portion is short. The thermal spraying can be performed again on the previously sprayed portions. Thus, even when the plug joint 60 is disposed over the entire circumference of the plug 50 along the outer edge of the upper surface as in the first embodiment, thermal spraying can be performed again on an outer edge of an upper surface of a replacing plug 50 and the upper opening edge of the plug placement hole 24 over the entire circumference.

Figure 13:
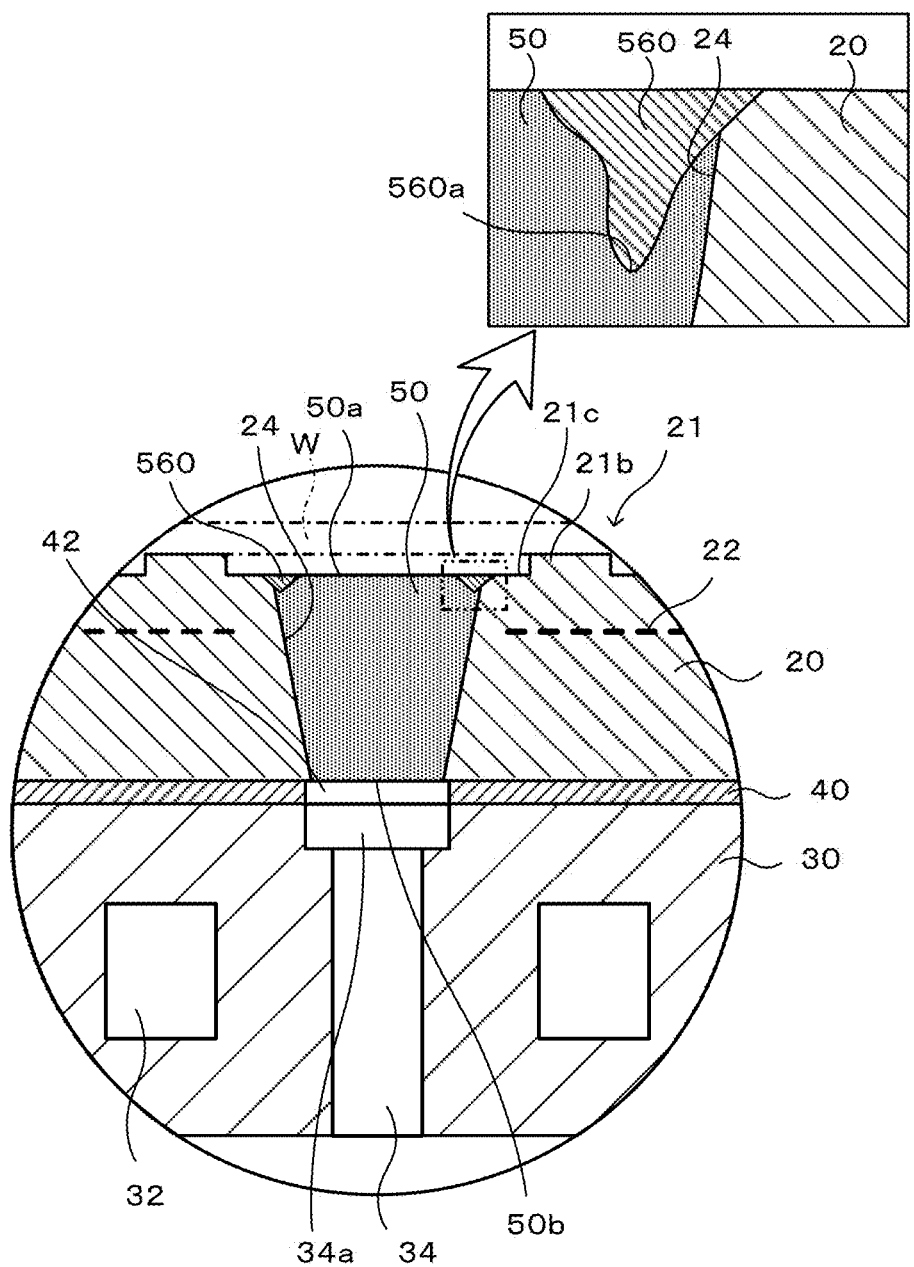
FIG. 13 is a vertical magnified cross-sectional view of a wafer placement table having a plug joint 560.

In the above-described second embodiment, the lowest portion 160a of the plug joint 160, which is a laser weld having an inverted triangular cross-sectional shape, is positioned at the boundary between the plug 50 and the plug placement hole 24, but the position should not be limited to this. For example, as a plug joint 560 illustrated in FIG. 13, a lowest portion 560a of the plug joint 560 may be located in the plug 50. In FIG. 13, the same symbols are assigned to the same components as those in the second embodiment. In this configuration, a portion to be laser-irradiated in the process of forming the plug joint 560 is in the plug. Thus, laser irradiation is unlikely to cause cracks in the ceramic plate 20. If cracks occur in the ceramic plate 20, the plug placement hole 24 and the electrode 22 may be connected by the cracks, which can readily cause defects, but the configuration illustrated in FIG. 13 can prevent such defects.

In the above-described first and second embodiments, the outer circumferential surface of the plug 50 and the inner circumferential surface of the plug placement hole 24 may be closely attached to each other. This can reduce electrical discharges between the outer circumferential surface of the plug 50 and the inner circumferential surface of the plug placement hole 24 during plasma generation.

International Application No. PCT/JP2023/007066, filed on Feb. 27, 2023, is incorporated herein by reference in its entirety.

What is claimed is:

1. A wafer placement table comprising:
   a ceramic plate having a wafer placement surface on an upper surface and a built-in electrode;
   a plug placement hole extending through the ceramic plate from a lower surface to the upper surface;
   a plug placed in the plug placement hole and allowing gas to pass therethrough; and
   a plug joint joining an outer edge of an upper surface of the plug and an upper opening edge of the plug placement hole and covering the outer edge of the upper surface of the plug from above,
   wherein, the plug placement hole is a tapered hole having a truncated conical space in which an upper opening area is larger than a lower opening area,
   the plug is a truncated conical member in which an upper surface area is larger than a lower surface area,
   the plug has a plug sloping surface at the outer edge of the upper surface,
   the plug placement hole has a placement hole sloping surface at the upper opening edge, and
   the plug joint is a thermal-sprayed portion filling a groove defined by the plug sloping surface and the placement hole sloping surface.

2. The wafer placement table according to claim 1,
   wherein the plug joint is disposed over an entire circumference of the plug along the outer edge of the upper surface.

3. The wafer placement table according to claim 1,
   wherein the plug joint is disposed at least two respective positions arranged in a circumferential direction along the outer edge of the upper surface of the plug.

4. The wafer placement table according to claim 1, further comprising a conductive plate bonded to a lower surface of the ceramic plate and having a gas supply channel in communication with the plug placement hole.

5. A wafer placement table comprising:
   a ceramic plate having a wafer placement surface on an upper surface and a built-in electrode;
   a plug placement hole extending through the ceramic plate from a lower surface to the upper surface;
   a plug placed in the plug placement hole and allowing gas to pass therethrough; and
   a plug joint joining an outer edge of an upper surface of the plug and an upper opening edge of the plug placement hole and covering the outer edge of the upper surface of the plug from above,
   wherein, the plug placement hole is a tapered hole having a truncated conical space in which an upper opening area is larger than a lower opening area,
   the plug is a truncated conical member in which an upper surface area is larger than a lower surface area,
   the plug joint is a laser weld where the outer edge of the upper surface of the plug and the upper opening edge of the plug placement hole have been laser welded,
   the laser weld has an inverted triangle shape when viewed in a vertical cross-section, and a lowest portion of the laser weld is located in the plug.

6. The wafer placement table according to claim 5,
   wherein the plug joint is disposed at least two respective positions arranged in a circumferential direction along the outer edge of the upper surface of the plug.

7. The wafer placement table according to claim 5, further comprising a conductive plate bonded to a lower surface of the ceramic plate and having a gas supply channel in communication with the plug placement hole.

8. The wafer placement table according to claim 5,
   wherein the plug joint is disposed over an entire circumference of the plug along the outer edge of the upper surface.

* * * * *